(12) United States Patent
Hamasaki et al.

(10) Patent No.: US 7,489,514 B2
(45) Date of Patent: Feb. 10, 2009

(54) LSI PACKAGE EQUIPPED WITH INTERFACE MODULE, INTERFACE MODULE AND CONNECTION HOLDING MECHANISM

(75) Inventors: Hiroshi Hamasaki, Hiratsuka (JP); Hideto Furuyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 404 days.

(21) Appl. No.: 11/203,959

(22) Filed: Aug. 16, 2005

(65) Prior Publication Data

US 2006/0038287 A1 Feb. 23, 2006

(30) Foreign Application Priority Data

Aug. 17, 2004 (JP) ............... 2004-237457

(51) Int. Cl.
*H05K 7/20* (2006.01)
(52) U.S. Cl. .................. 361/721; 361/801; 361/802
(58) Field of Classification Search ........... 361/760, 361/721, 741, 720, 736, 748, 801, 802; 257/777, 257/778; 385/88, 92
See application file for complete search history.

(56) References Cited

U.S. PATENT DOCUMENTS

| | | | | |
|---|---|---|---|---|
| 5,282,111 | A * | 1/1994 | Hopfer | 361/704 |
| 5,568,868 | A * | 10/1996 | Keller et al. | 206/724 |
| 6,487,079 | B2 * | 11/2002 | Katsui | 361/704 |
| 6,906,407 | B2 * | 6/2005 | Byers et al. | 257/686 |
| 2004/0218372 | A1 | 11/2004 | Hamasaki et al. | |
| 2005/0063651 | A1 | 3/2005 | Hamasaki et al. | |
| 2005/0141824 | A1 | 6/2005 | Furuyama et al. | |
| 2005/0156304 | A1 | 7/2005 | Furuyama et al. | |
| 2006/0038287 | A1 | 2/2006 | Hamasaki et al. | |
| 2006/0170091 | A1 * | 8/2006 | Karnezos | 257/686 |

FOREIGN PATENT DOCUMENTS

| | | |
|---|---|---|
| JP | 55-135483 | 3/1979 |
| JP | 6-224531 | 8/1994 |
| JP | 7-92354 | 4/1995 |
| JP | 7-230022 | 8/1995 |
| JP | 2004-31455 | 1/2004 |

(Continued)

OTHER PUBLICATIONS

U.S. Appl. No. 11/442,276, filed May 30, 2006, Hamasaki, et al.

(Continued)

*Primary Examiner*—Hung S Bui
(74) *Attorney, Agent, or Firm*—Oblon, Spivak, McClelland, Maier & Neustadt, P.C.

(57) ABSTRACT

I an LSI package, an interface module includes with an interposer having a signal processing LSI mounted thereon and has electric connection terminals for connection to a mounting board and a transmission line for transmitting a high-speed signal to an external wiring. An electric connection terminal is formed in each of the interposer and the interface module for electrically connecting the interposer and the interface module to each other by the mechanical contact, and a fixing holder is mounted for allowing the electric connection terminals to hold the electric connection between the interposer and the interface module. Thus, it is possible to suppress the increase in the manufacturing cost that is caused by the complex construction of the assembly.

13 Claims, 9 Drawing Sheets

FOREIGN PATENT DOCUMENTS

JP         2004-31555         1/2004

OTHER PUBLICATIONS

U.S. Appl. No. 10/920,365, filed Aug. 18, 2004, Hideto Furuyama, et al.

U.S. Appl. No. 11/081,617, filed Mar. 17, 2005, Hideto Furuyama, et al.

Ichiro Hatakeyama, et al., "System LSI Module with Optical I/O Interfaces (1) Module Configuration and Design", Proceedings of the 2003 IEICE Society Conference, C-3-123, 2003, p. 256.

U.S. Appl. No. 11/204,168, filed Aug. 16, 2005, Furuyama, et al.

U.S. Appl. No. 11/203,959, filed Aug. 16, 2005, Hamasaki, et al.

U.S. Appl. No. 11/496,446, filed Aug. 1, 2006, Furuyama, et al.

U.S. Appl. No. 11/203,959, filed Aug. 16, 2005, Hamasaki et al.

U.S. Appl. No. 11/233,175, filed Sep. 23, 2005, Furuyama et al.

* cited by examiner

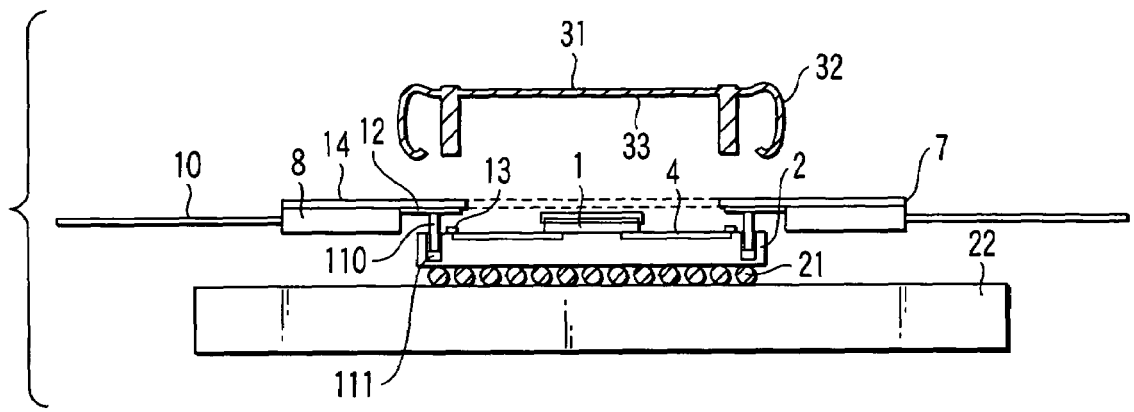
F I G. 3
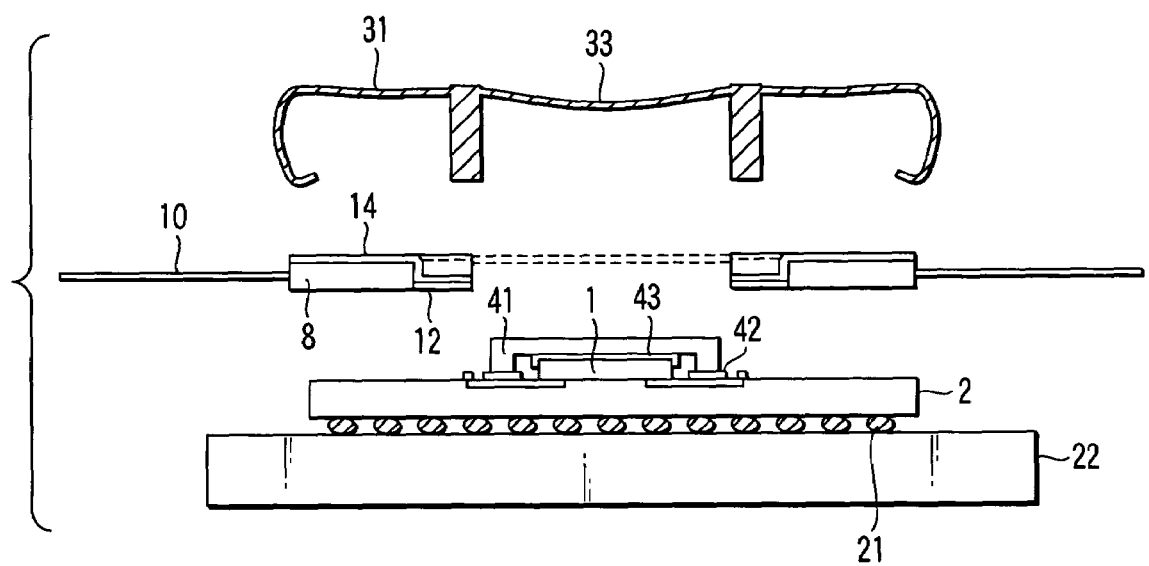
F I G. 4A
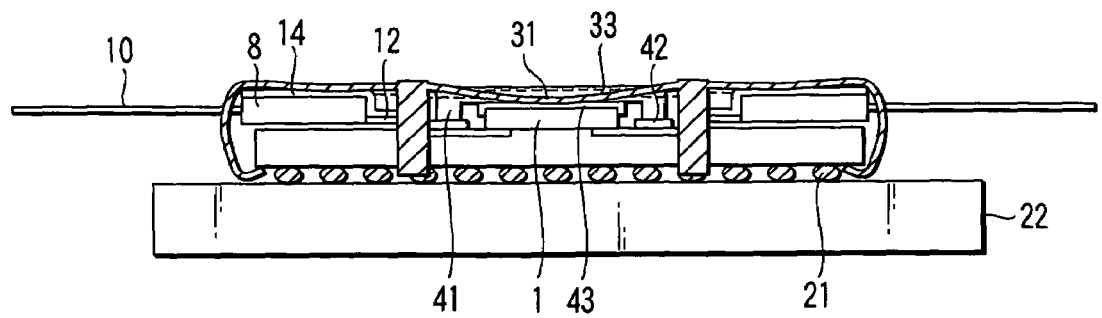
F I G. 4B

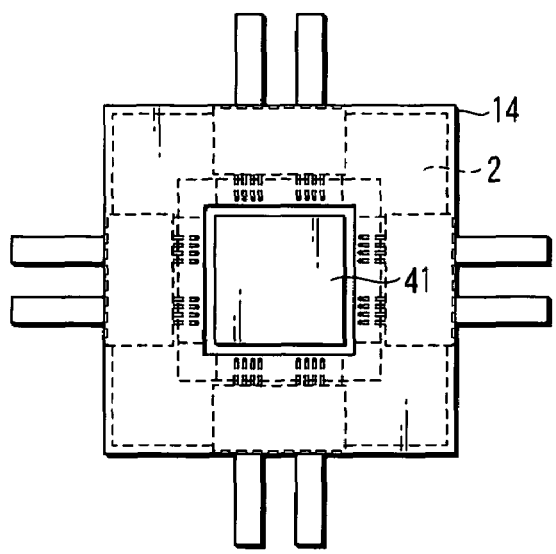
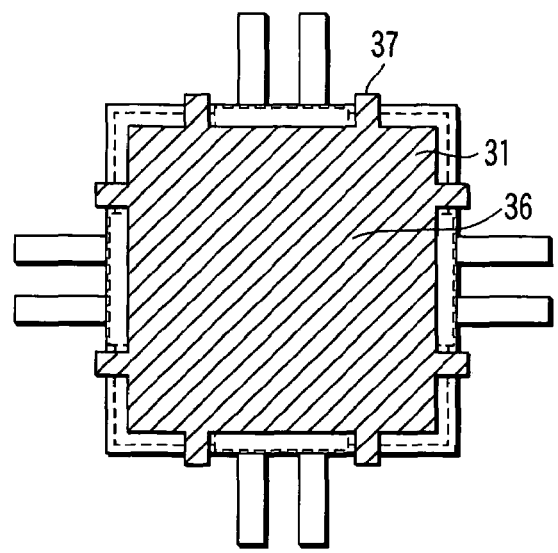
F I G. 7A          F I G. 7B
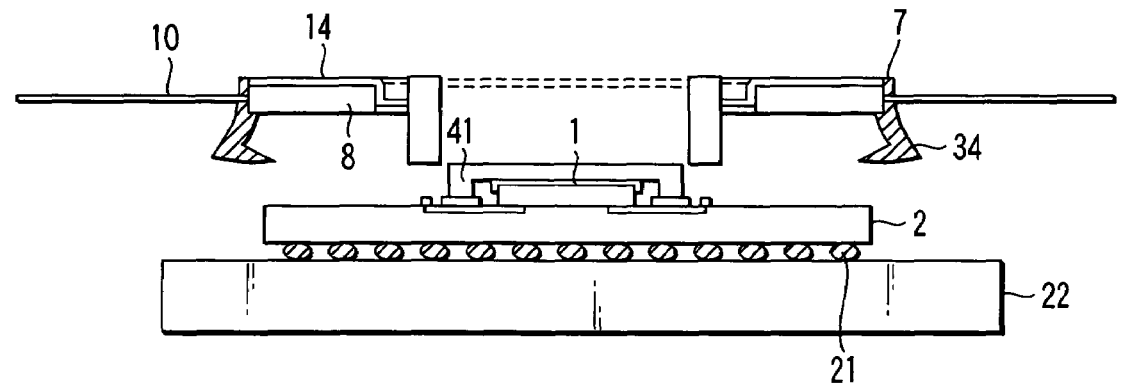
F I G. 8A
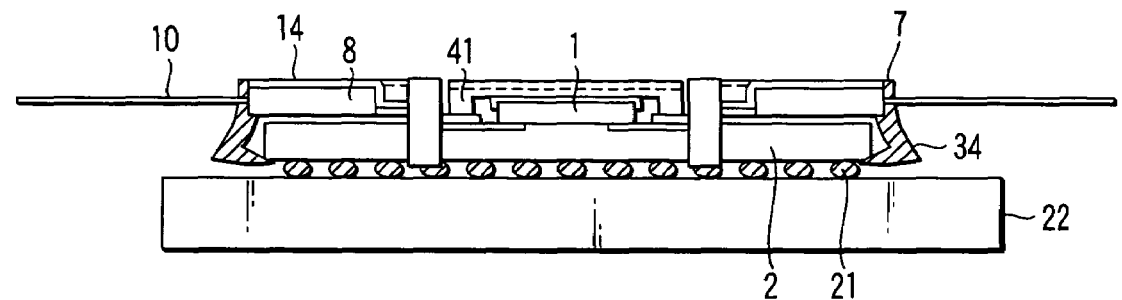
F I G. 8B

LSI PACKAGE EQUIPPED WITH INTERFACE MODULE, INTERFACE MODULE AND CONNECTION HOLDING MECHANISM

CROSS-REFERENCE TO RELATED APPLICATIONS

This application is based upon and claims the benefit of priority from prior Japanese Patent Application No. 2004-237457, filed Aug. 17, 2004, the entire contents of which are incorporated herein by reference.

BACKGROUND OF THE INVENTION

1. Field of the Invention

The present invention relates to an LSI package equipped with an interface module, an interface module and a connection holder, particularly, to an LSI package equipped with an interface module for signal transmission to external wiring of a high-speed signal, an interface module used in the particular LSI package, and a connection holder for holding the connected state between the interface module and an interposer.

2. Description of the Related Art

In recent years, the clock frequency of an LSI has became higher and higher. In the CPU for a personal computer, a clock frequency which is not lower than GHz order is being put into the practical use. However, the pace of improvement in the throughput of the interface between LSIs is moderate, compared with the elevation of the clock frequency, so as to generate a bottleneck in the performance of the personal computer. Such being the situation, research is being conducted in an attempt to improve the throughput of the interface.

In order to improve the throughput of the interface, it is necessary to improve the signal frequency per terminal and to increase the number of terminals. However, if the number of terminals is increased, the areas of the LSI and the package are increased, giving rise to the limitation that the length of the internal wiring is increased so as to make it impossible to operate at high frequencies. Under the circumstances, it is of high importance to increase the signal frequency per terminal. On the other hand, if the signal frequency per terminal is increased, the attenuation of the electric signal is made large so as to increase the influence given by impedance mismatch to the reflection, with the result that a limitation is generated in the line length. Such being the situation, it is necessary to use as a high-speed signal transmission line having the impedance mismatch and the attenuation of the electric signal suppressed as much as possible.

If a transmission line is to be formed accurately on a mounting board, the manufacturing cost is increased. In addition, the conductor loss caused by the dielectric loss and the skin effect is increased in accordance with increase in the transmission speed so as to make it difficult to transmit a signal over a sufficiently long distance. Under the circumstances, a system for performing signal transmission by using an optical signal is proposed in, for example, Japanese Patent Disclosure (Kokai) No. 2004-31455 and "Electronics Society Meeting by Electronic Information Communication Institute, C-3-123, 2003". It is proposed in these prior art documents that high-speed wiring, which is not mounted on a mounting board, is mounted on an interposer alone, and that the electric signal is converted by an optical element mounted on the interposer into an optical signal by the utilizing photoelectric conversion so as to carry out the signal transmission by using the optical signal.

To be more specific, Japanese Patent Disclosure No. 2004-31455 quoted above teaches an assembly in which an optical element is mounted as a bare chip directly on an interposer substrate, and the optical element on the interposer substrate is optically coupled with the optical waveguide when the interposer is mounted on a mounting board. In this assembly, however, it is said to be difficult to maintain the optical accuracy because of the difference in the thermal expansion coefficients of the mounting board and the interposer. Also, if the optical element is mounted as a bare chip, it is difficult to secure the reliability of the apparatus. It follows that it is necessary to take an appropriate countermeasure. For example, it is necessary to bury the optical element section in a resin which is transparent to the wavelength used for the signal transmission. It is also necessary to employ an extra work of allowing the optical element to be optically coupled with the optical waveguide on the mounting board. It follows that the manufacturing process must be carried out under many limitations so as to increase the manufacturing cost. Further, since it is necessary to separately attach the optical waveguide to the mounting board, the mounting process is made complex, leading to a further increase in the manufacturing cost. It should also be noted that, in the event of the disorder of the optical element, it is necessary to renew the optical element together with the costly LSI used for the signal processing.

An assembly in which an optical part is mounted directly on an LSI package is disclosed in "Electronics Society Meeting by Electronic Information Communication Institute, C-3-123, 2003" quoted above. In this assembly, it is necessary to apply reflow mounting of the LSI package on a mounting board under the state that the optical part is mounted on the LSI package, or it is necessary to apply a reflow mounting of the LSI package on the mounting board, followed by mounting the optical part on the LSI package. It follows that, in the prior art assembly disclosed in this publication, the optical part or the assembly material such as adhesive, which is thermally weak, interferes with the reflow mounting in the stage of mounting the LSI package on the mounting board. Also, since the soldered portions of the parts interfere with each other in the soldering stage, it is necessary to use different kinds of solders differing from each other in melting point, with the result that the mounting procedure is limited so as to give rise to problems in the mounting stage. Further, for holding the position of the optical connector, it is necessary to separately prepare a push holder. In other words, the holder tends to be made bulky by performing the optical connection in the form of a connector.

It should also be noted that, with increase in the frequency of the signal, the power consumption per terminal tends to be increased in general. For example, the CPU used in a personal computer, has increased the power consumption of the LSI to 70 to 80 W in recent years. Such being the situation, an assembly in which a heat spreader and a gigantic heat sink are mounted so as to increase the heat dissipating area and a formed cooling is performed by using, for example, a fan, is included in the signal processing LSI. On the other hand, since it is necessary to shorten the wiring length between the signal processing LSI and the interface module as much as possible as pointed out previously, a spatial allowance for mounting another heat sink for the interface module is eliminated in the case of installing a heat sink for the signal processing LSI.

Under the circumstances, it is considered effective for the heat sink to be shared by the signal processing LSI and the interface module so as to dissipate the heat simultaneously. In such an assembly, however, the upper surfaces of the signal processing LSI and the interface module are required to be exactly flush with each other when the signal processing LSI and the interface module are simultaneously mounted on the interposer. Alternatively, the difference in height between the signal processing LSI and the interface module is required to fall within a prescribed range that is defined strictly. However, it is difficult to practically satisfy these requirements. In addition, since the interface module is soldered in this assembly, too, it is necessary to renew the interface module together with the costly signal processing LSI if the interface module is out of order.

BRIEF SUMMARY OF THE INVENTION

An object of the present invention is to provide an LSI package, which permits eliminating the increase in the manufacturing cost caused by the complex construction of the assembly and permits eliminating the problem in the mounting stage such as the interference of the solders in the soldering stage, and also permits increasing the throughput of the interface, also provide an interface module used in the LSI package, and further provide a connection holder for fixing and holding satisfactorily the interface module and an interposer.

According to an aspect of the present invention, there is provided an LSI package comprising:

an interposer on which a signal processing LSI is mounted;

an interface module equipped with signal transmission lines connected to an external equipment;

first electric connection terminals provided on the interposer and the interface module to mechanically and electrically connect the interposer and the interface module to each other; and a connection holder configured to hold the electric connection between the interposer and the interface module.

BRIEF DESCRIPTION OF THE SEVERAL VIEWS OF THE DRAWING

FIG. 3 is a cross-sectional view schematically showing the construction of a modification of the LSI package assembly comprising the interface module shown in FIG. 1;

FIGS. 4A and 4B are cross-sectional views collectively showing schematically the construction of an LSI package assembly comprising an interface module according to a second embodiment of the present invention;

FIGS. 7A and 7B are plan views collectively showing schematically the construction of an LSI package comprising the interface module shown in FIGS. 6A and 6B;

FIGS. 8A and 8B are cross-sectional views collectively showing schematically the manufacturing process of an LSI package according to a fourth embodiment of the present invention;

DETAILED DESCRIPTION OF THE INVENTION

Figure 1A:
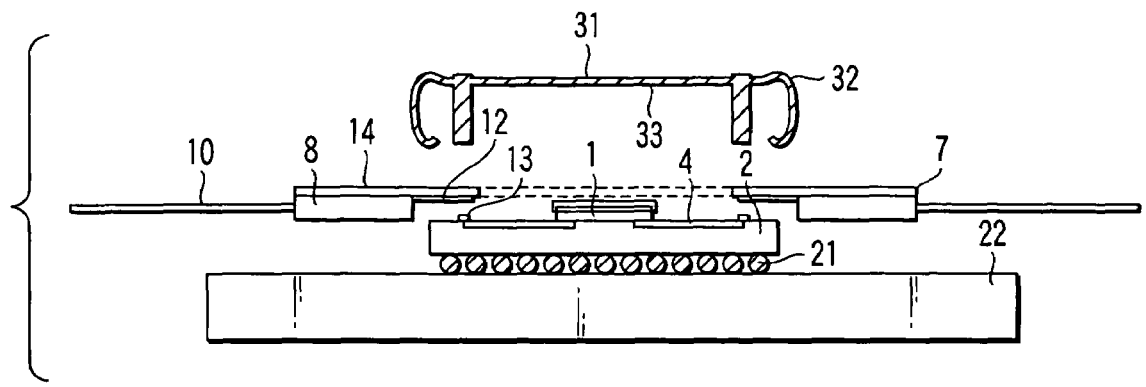
FIGS. 1A and 1B are cross-sectional views collectively showing schematically the construction of an LSI package according to a first embodiment of the present invention.

The interface modules according to various embodiments of the present invention, the LSI packages comprising the various interface modules of the present invention, and the connection holder of the present invention will now be described with reference to the accompanying drawings. Incidentally, in the accompanying drawings, the same or similar members of the assembly of the present invention are denoted by the same reference numerals for avoiding the overlapping description. Also, the drawings are intended to show schematically the construction of the assembly and, thus, the relationship between the thickness and the planar size, the ratio of the thickness of each layer, etc., differ from those of the actual assembly. The specific thickness and size should be judged in view of the description given below. It should also be noted that the drawings differ from each other in some case in the relationship between the thickness and the planar size and in the thickness ratio of the layers.

First Embodiment

Figure 1B:
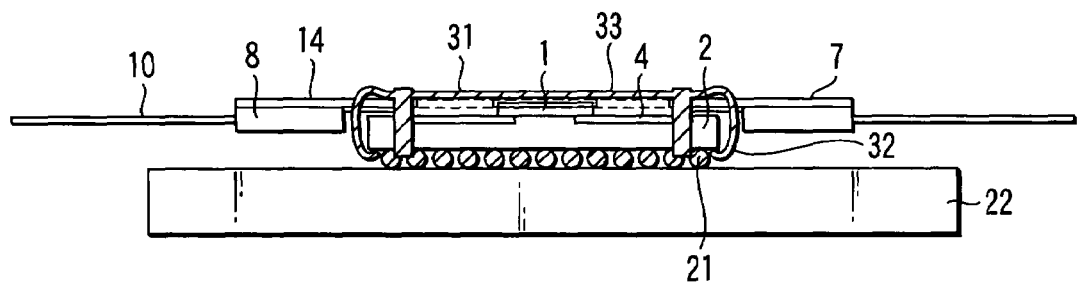

FIG. 1A is a cross-sectional view schematically showing the construction of an LSI package according to a first embodiment of the present invention before an optical interface module is electrically connected and fixed to the LSI package. On the other hand, FIG. 1B is a cross-sectional view schematically showing the construction of an LSI package comprising the interface module shown in FIG. 1A after the optical interface module is fixed to the LSI package. Further, FIG. 2 is an upper view (plan view) showing the construction of the LSI package comprising the interface module shown in FIG. 1B.

Figure 2:
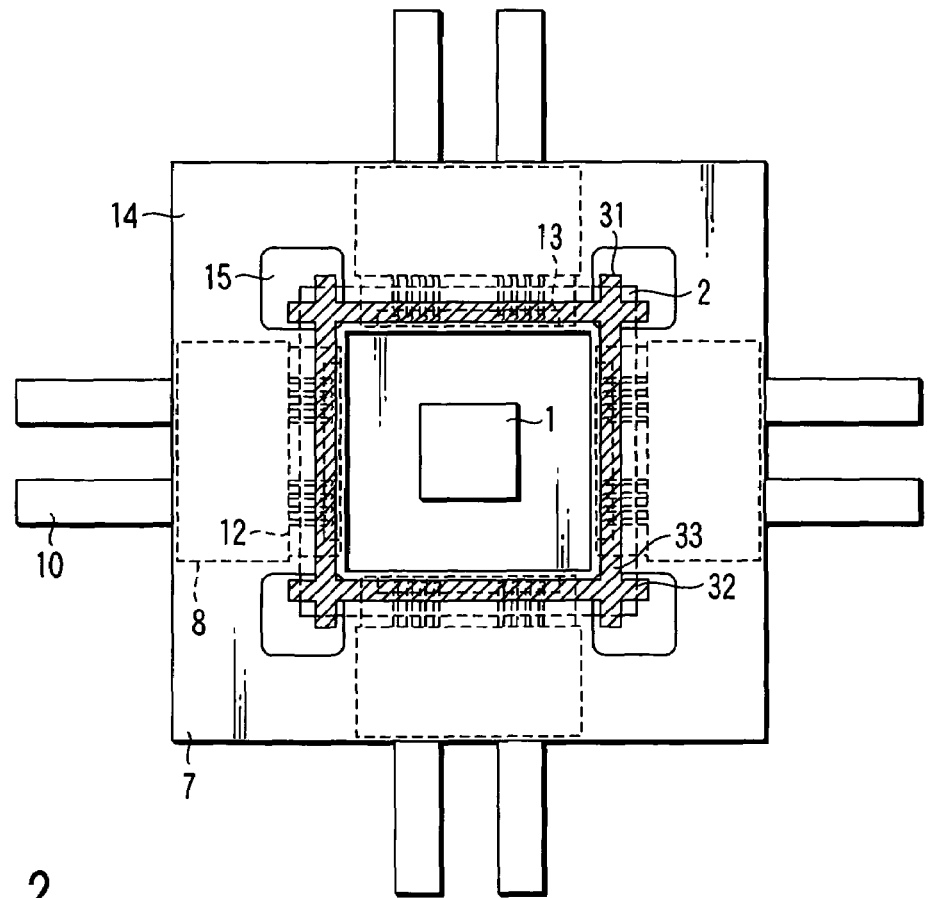
FIG. 2 is a plan view schematically showing the construction of the LSI package comprising the interface module shown in FIGS. 1A and 1B.

Incidentally, the LSI package assembly comprising the interface module shown in FIG. 2 is disclosed in U.S. patent application Ser. No. 10/778,030, filed by the present inventors (Hamasaki et al) on Feb. 3, 2004. In the following description, the LSI package comprising the interface module shown in FIGS. 1A and 1B is explained briefly on the assumption that the specification of the U.S. Patent Application quoted above is incorporated in this application. For the more detailed understanding of the LSI package comprising the interface module, attention should be paid to the U.S. Patent Application quoted above.

A reference numeral 1 shown in FIGS. 1 and 2 denotes an LSI for the signal processing. As shown in the drawings, the LSI 1 is mounted on and electrically connected to an interposer 2. A high-speed signal wiring 4, which is formed on the interposer 2, is connected at one end to a signal input-output terminal of the LSI 1. The other end of the high-speed signal wiring 4 is withdrawn up to the surface of the interposer 2 so as to be formed on the terminal that is to be electrically connected to an interface module 7. Connection terminals 21 that are to be electrically connected to a mounting board 22 are arranged on the lower surface of the interposer 2. An electric power is supplied to the interposer 2 through the connection terminals 21. Also, a low-speed control signal is supplied into and discharged from the interposer 2 through the connection terminals 21.

A reference numeral 7 denotes an optical interface module. The module 7 comprises a photoelectric converting section 8 for supplying an optical signal into an optical fiber 10 acting as a transmission line for a high-speed signal and for discharging the optical signal from the optical fiber 10. The module 7 is formed on the electric connecting section of the interposer 2 in a flexible wiring board (FPC) 12 and is mounted on a stiffener 14 acting as a supporting substrate. The photoelectric converting section 8 comprises, for example, an optical element such as a light-emitting element or a light-receiving element, an optical interface IC for driving the optical element, and an optical coupling section that is coupled with the optical fiber 10 for supplying an optical signal into the optical element and for discharging the optical signal from the optical element. The optical interface module 7 is connected to the high-speed signal wiring 4 of the interposer 2 via an anisotropic conductive sheet 13 for performing an electric connection by the mechanical contact. In the present invention, the mechanical contact implies the contact for achieving an electric connection by utilizing the pressure such as the pushing, engagement, coupling or a pressure welding. For achieving the mechanical contact, it is possible to employ, for example, the contact using the anisotropic conductive sheet and the coupling between a pin and a jack, which is disclosed in Japanese Patent Application No. 2003-39828.

It should be noted that portion of the high-speed signal wiring 4 which is withdrawn onto the surface of the interposer 2, the FPC 12 formed on the optical interface module 7, and the anisotropic conductive sheet 13 collectively perform the function of electric connection terminals for electrically connecting the interposer 2 to the optical interface module 7.

In assembling the LSI package, prepared is a connection holder 31 for holding the mechanical and electric connection between the optical interface module 7 and the interposer 2. The connection holder 31 is formed in a clip-shaped assembly using a spring member made of, for example, a hardened spring steel and is designed to generate pressure in the vertical direction when mounted on the interposer 2 and the optical interface module 7. A hole is formed in that region of the connection holder 31 which is positioned above the LSI 1 such that the connection holder 31 is shaped like projecting parallels so as not to impair the heat dissipation from the LSI 1 in the stage of mounting the connection holder 31 to the interposer 2 and the optical interface module 7.

In the LSI package according to the first embodiment of the present invention, the interposer 2 is subjected to a reflow mounting to the mounting board 22 together with other mounting parts (not shown), as shown in FIG. 1. Then, the anisotropic conductive sheet 13 is mounted on the terminal of the high-speed signal wiring 4 withdrawn onto the interposer 2. Under this condition, the connection holder 31 is mounted on the optical interface module 7 and the interposer 2 so as to push the optical interface module 7 and the interposer 2 in the vertical direction, with the result that the interposer 2 and the optical interface module 7 are electrically connected and fixed to each other.

According to the assembly described above, the optical interface module 7 can be connected mechanically and electrically to the interposer 2 as shown in FIG. 2, after the interposer 2 is mounted on the mounting board 22 as shown in FIG. 1 by the process steps substantially equal to those in the mounting of the ordinary BGA package LSI. To be more specific, the optical interface module 7 can be mounted on the mounting board 22 together with other parts after the electrical mounting of the interposer 2, i.e., the heat treatment such as the reflow treatment and the laser heating. In other words, employed in the present invention is an assembly having a high electrical mounting affinity. Also, by using the connection holder, the electrical connection can be retained and an inspection such as a simple power conduction test can be performed under the state that the electrical connection is retained.

Also, the optical interface module 7 is packaged individually so as to make it possible to secure high reliability, and the optical interface module 7 itself is an assembly that can be inspected so as to make it possible to suppress the lowering of the yield of the mounting board 22 caused by the defective optical element. Further, since the optical interface module 7 can be mounted by the mechanical contact without employing a heat treatment, it is possible to suppress the limitation to the mounting caused by the employment of the pigtail system. Of course, since a high-speed signal is transmitted from the interposer 2 to reach the optical interface module 7 via the anisotropic conductive sheet 13 without passing through the wiring of the mounting board 22, the high-frequency signal can be transmitted through a short distance, i.e., the transmitting distance of the high-frequency signal is short.

It should also be noted that, since the optical interface module 7 is connected directly by simply using the connection holder 31 in place of connecting the optical fiber 10 by using a connector, the entire apparatus can be miniaturized. Further, the optical fiber 10 is inserted in the lateral direction and the electric wiring and the electric connection are realized by the FPC and the anisotropic conductive sheet, with the result that the optical interface module 7 can be formed thin. It follows that the upper surface of the optical interface module 7 can be made lower than the upper surface of the LSI 1 relative to the interposer 2, so as to make it possible to secure easily the installing space of a large heat sink for the LSI 1.

In the assembly shown in the drawings, the electric signal is withdrawn to a peripheral portion of the interposer 2 by the FPC 12, and the particular construction is realized by withdrawing the constituting element that tends to be made thick such as the photoelectric converting section 8 and the optical fiber 10 to the outside of the interposer 2 in which it is easy to secure the mounting space. It follows that the stiffener 14 is formed in the shape of a frame having a hole formed in the center in a manner to avoid the peripheral portion of the LSI 1, as shown in FIG. 2.

Further, a hole 15 is formed in a position corresponding to the fixing portion of the interposer 2 so as to make it possible to mount the connection holder 31. Since the optical fiber 10 is shaped such that the fiber 10 is withdrawn in four directions as shown in FIG. 2, it is desirable to mount the connection holder 31 in the vicinity of the four corners of the interposer 2. It should also be noted that a hook-shaped section 32 of the fixing holder 31 is engaged with the interposer 2 so as to ensure the pushing force in the vertical direction, and it is desirable to arrange the electric connecting section on a straight line joining the hook-shaped sections 32 on the opposite sides having the interposer 2 sandwiched therebetween because the particular arrangement permits simplifying the construction of the connection holder 31.

The assembly shown in FIG. 1 covers the case where the side section 33 of the connection holder 31 is flat. However, it is also possible for the central portion of the side section 33 to be curved downward so as to secure the pressure generation. It is also possible for that portion alone which actually faces the electric connection section to be partially curved downward in place of curving downward the entire side section 33. The particular construction produces the effect that the contact area can be diminished so as to increase the pressure per unit area.

As described above, according to the first embodiment of the present invention, the optical interface module 7 is mounted directly on the interposer 2 so as to make it possible to shorten the electric wiring length between the signal processing LSI 1 and the interface module 7. As a result, it is possible to mount the interface module at a high throughput without requiring a costly transmission line. Also, since the external wiring of the interface module 7 is coupled directly with the optical fiber 10 in place of the coupling using a connector, the construction of the interface module is prevented from being made complex. Further, since the interposer 2 and the interface module 7 can be coupled with each other by the electrical connection terminal, it is possible to avoid the problem of interference of the solders of the interposer 2 and the interface module 7. Also, since the electric connection terminal is used in the first embodiment of the present invention, the electrical connection can be secured by simply applying a pushing force to the connection holder 31 in the vertical direction.

It is possible to employ the assembly as shown in FIG. 3 as a modification of the assembly shown in FIG. 1. In the assembly shown in FIG. 3, a positioning pin 110 mounted on the interface module 7 is engaged with an engaging hole 111 formed in the interposer 2 so as to achieve an accurate positional relationship between the interface module 7 and the interposer 2. According to the assembly shown in FIG. 3, the positions of the interface module 7 and the interposer 2 can be aligned at an accuracy higher than the mechanical accuracy of the outer shape in the case where the electric connecting section between the interface module 7 and the interposer 2 is made very small so as to achieve the electric connection without fail.

Second Embodiment

Figure 5:
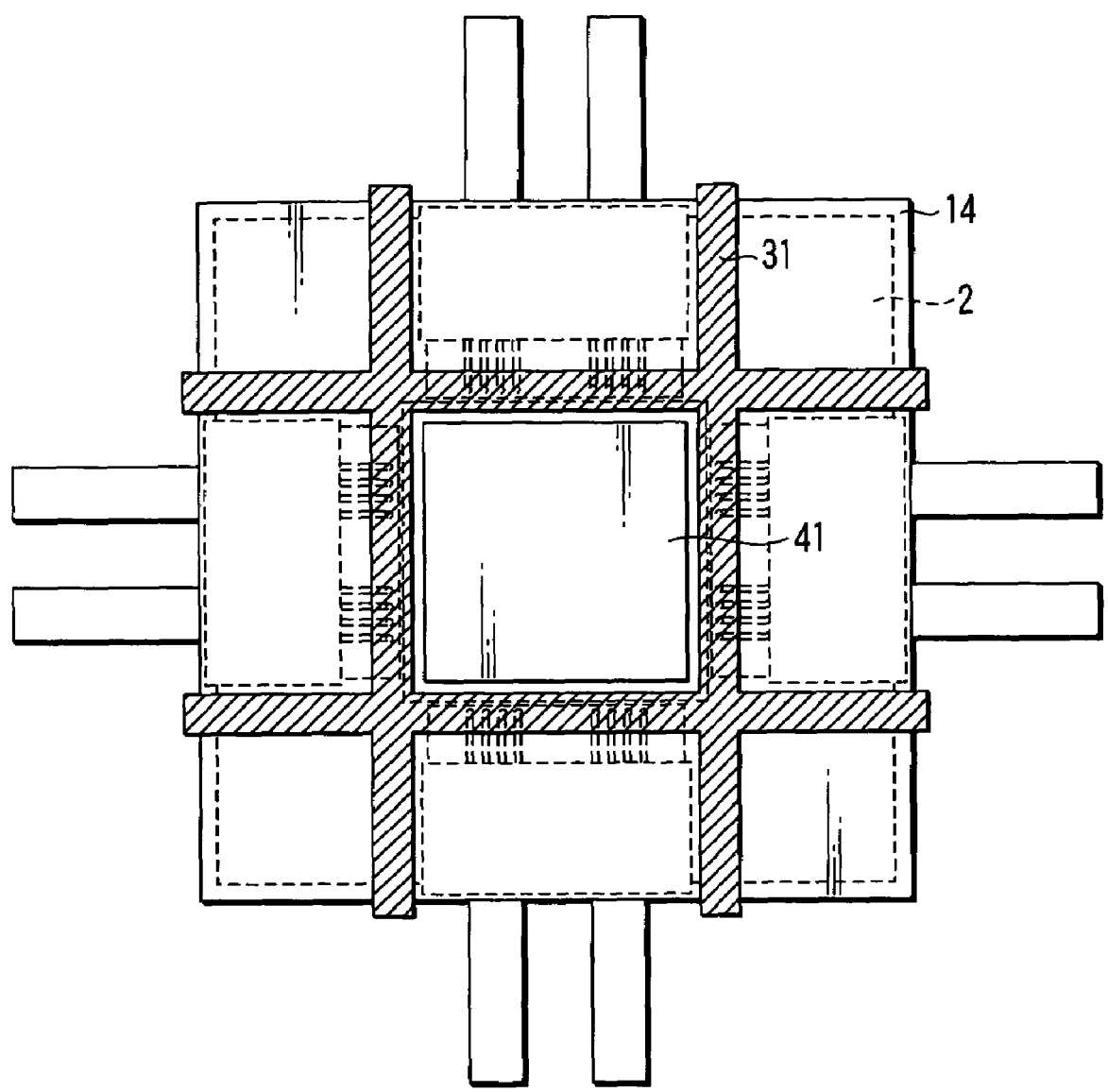
FIG. 5 is a plan view schematically showing the construction of an LSI package comprising the interface module shown in FIGS. 4A and 4B.

FIGS. 4A, 4B and 5 collectively show schematically the construction of an LSI package according to a second embodiment of the present invention, wherein FIG. 4A is a cross-sectional view showing the state before the electrical connection and fixation of the optical interface module, FIG. 4B is a cross-sectional view showing the state after the fixation of the optical interface module, and FIG. 5 is a plan view showing the arrangement of the assembly as viewed from above after the connection and fixation. Incidentally, in FIGS. 4A, 4B and 5, the portions equal to those shown in FIG. 1 are denoted by the same reference numerals so as to avoid the overlapping description.

In the first embodiment, the LSI 1 is mounted in the form of a bare chip on the interposer 2. In the second embodiment, however, the LSI 1 is mounted on the interposer 2 by bonding a heat spreader 41 to the interposer 2 by using an adhesive 42 in order to protect the bare chip and to achieve the heat diffusion. The inner surface of the heat spreader 41 is thermally connected to the back surface of the chip by a heat conductive adhesive 43. In this case, the height from the upper surface of the interposer 2 can be set larger than that of the chip and, thus, a large mounting space can be secured on the interposer 2 in the peripheral portion of the heat spreader 41.

It is possible to make the interface module 7 substantially equal in size to the interposer 2 by shortening the withdrawing length of the FPC 12. Therefore, the connection holder 31 can be mounted on the outer peripheral edge portion of the interface module so as to eliminate the mounting hole formed in the stiffener 14, i.e., hole 15 shown in FIG. 1, and, thus, the construction of the assembly can be simplified. It should be noted that the FPC 12, the photoelectric converting section 8, and the optical fiber 10 can be mounted on the interposer 2 and, thus, a difference in height is generated by the difference in thickness among these members 12, 8 and 10. However, since a pedestal-shaped step is formed on the stiffener 14 as shown in FIG. 4B, it is possible to absorb the difference in height among the members noted above.

If the step of the stiffener 14 is formed by the pressing or drawing process, it is possible for a groove to be formed on the back surface. However, the groove thus formed can be utilized as a guide in mounting the connection holder 31. In this case, it is desirable for the connection holder 31 to push the back surface of the stiffener 14 at the position corresponding to the position right above the electric connecting section under the state that the side 33 of the connection holder 31 is curved downward in conformity with the groove formed on the back surface of the stiffener 14.

Third Embodiment

Figure 6A:
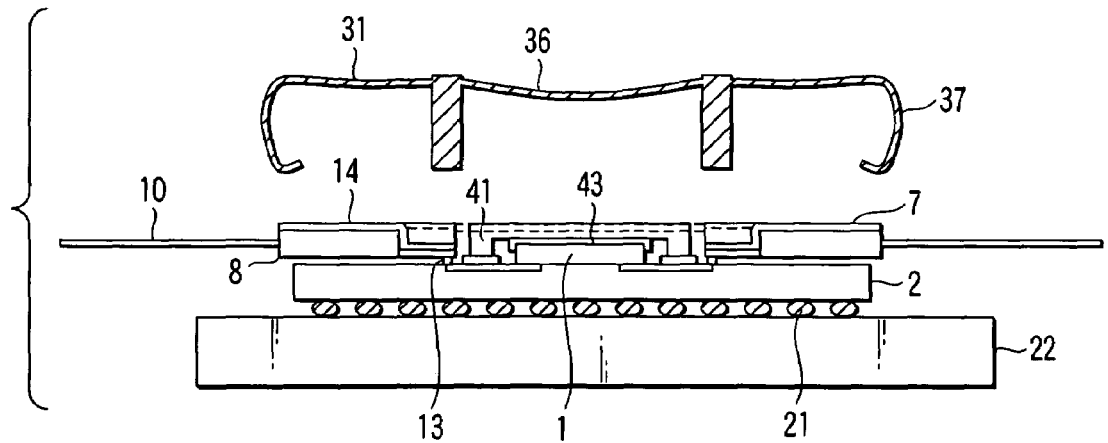
FIGS. 6A, 6B, 6C are cross-sectional views collectively showing schematically the manufacturing process of an LSI package according to a third embodiment of the present invention.
Figure 6B:
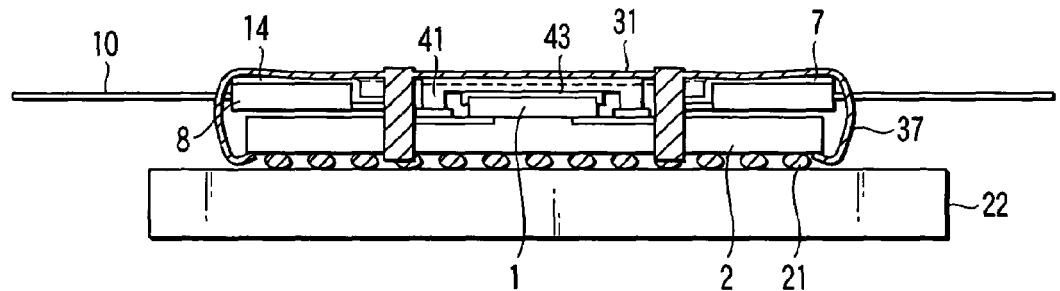
Figure 6C:
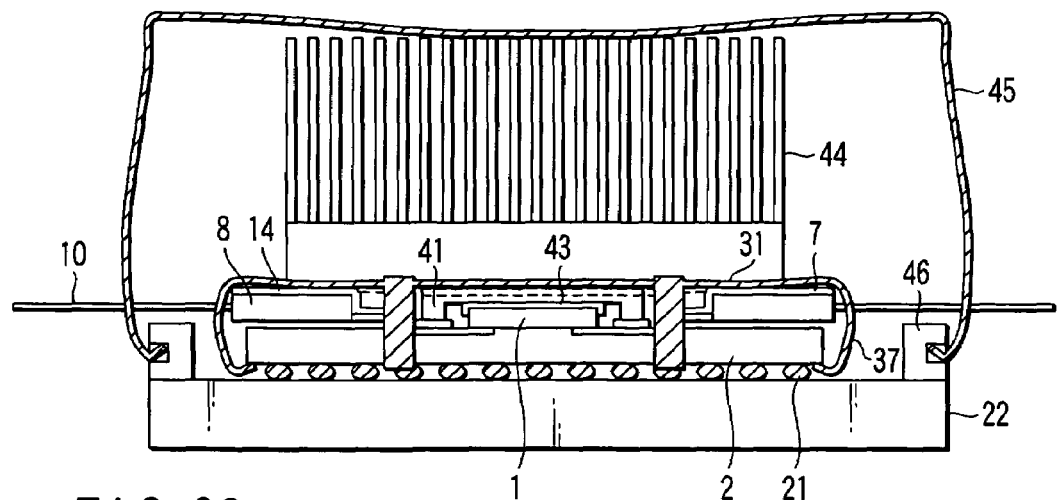

FIGS. 6A, 6B, 6C, 7A and 7B collectively show schematically the construction of an LSI package according to a third embodiment of the present invention, wherein FIG. 6A is a cross-sectional view showing the state before the electrical connection and fixation of the optical interface module, FIG. 6B is a cross-sectional view showing the state after the fixation of the optical interface module, FIG. 6C is a cross-sectional view showing the state that a heat sink is mounted on the upper portion. Further, FIG. 7A is a plan view showing the arrangement of the assembly as viewed from above before the clip fixation, and FIG. 7B is a plan view showing the arrangement of the assembly as viewed from above after the clip fixation. Incidentally, in FIGS. 6A, 6B, 6C, 7A and 7B, the portions equal to those shown in FIG. 1 are denoted by the same reference numerals so as to avoid the overlapping description.

According to the third embodiment of the present invention, a clip 31 is used as the connection holder. The clip 31 is not shaped like the projecting parallels and comprises a flat section 36 and a hooked section 37 formed at the edge of the flat section 36. The assembly according to the third embodiment of the present invention permits pushing the upper surface of the heat spreader 41 and the upper surface of the interface module 7 simultaneously. Also, the upper surface of the heat spreader 41 can be made flush with the upper surface of the interface modulator 7 by controlling the collapsed amount of the anisotropic conductive sheet 13. It follows that the clip 31 performs the function of a fixing holder and also performs the function of flattening the upper surface, and the LSI 1 and the photoelectric converting section 8 can be cooled simultaneously by the heat sink 44.

A member 45 performs the function of holding down the heat sink 44 and serves to fix the heat sink 44 in the form of being engaged with a retention tool 46 mounted on the mounting board. It is desirable to insert a heat conductive material in the clearance between the clip 31 and the heat spreader 41 and the clearance between the clip 31 and the stiffener 14 of the interface module 7 so as to improve the heat dissipating efficiency.

Fourth Embodiment

Figure 9:
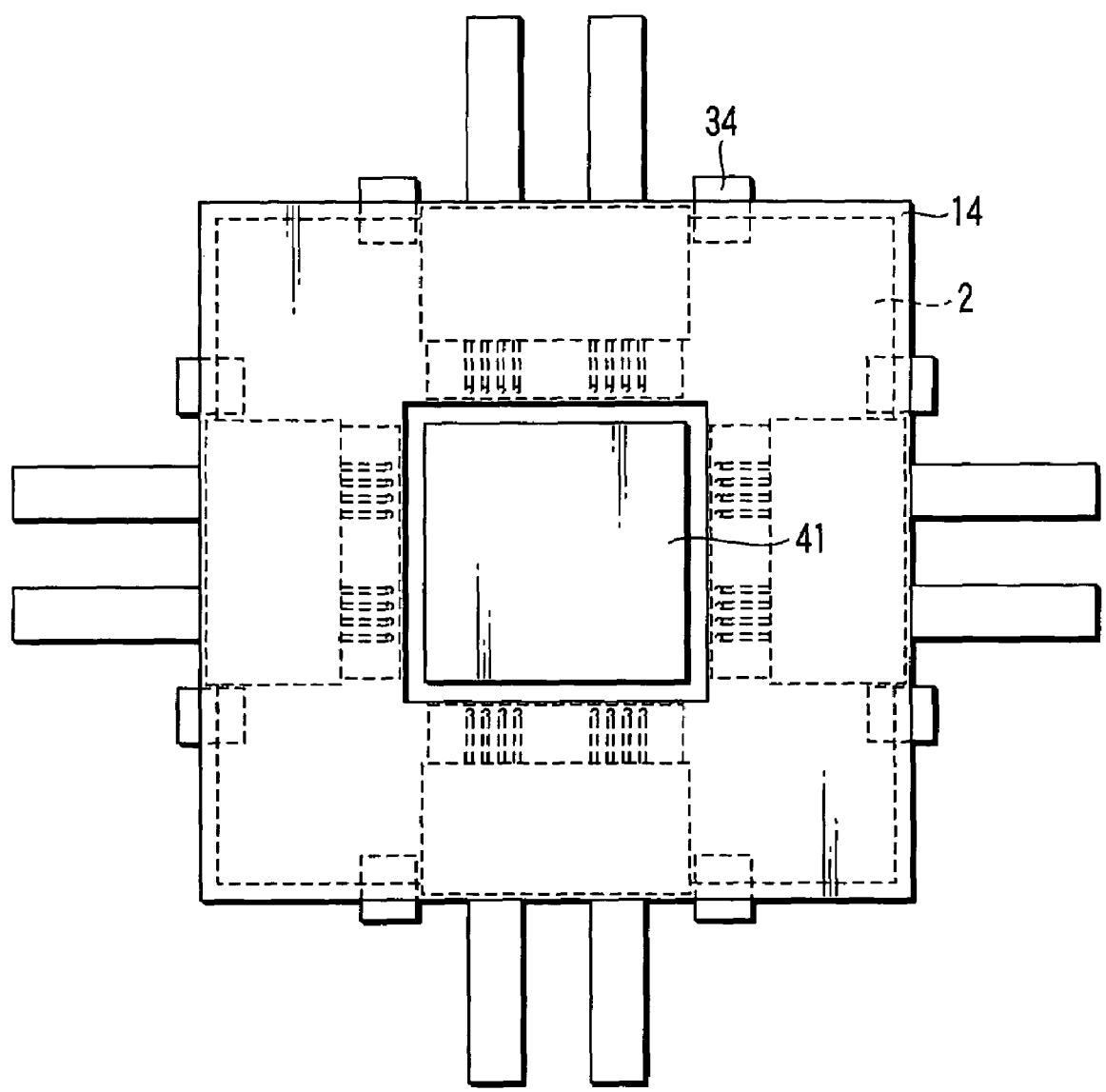
FIG. 9 is a plan view schematically showing the construction of the LSI package comprising the interface module according to the fourth embodiment of the present invention.

FIGS. 8A, 8B, and 9 collectively show schematically the construction of an LSI package according to a fourth embodiment of the present invention, wherein FIG. 8A is a cross-sectional view showing the state before the electrical connection and fixation of the optical interface module, FIG. 8B is a cross-sectional view showing the state after the fixation of the optical interface module, and FIG. 9 is a plan view showing the arrangement of the assembly as viewed from above after the connection and fixation. Incidentally, in FIGS. 8A, 8B and 9, the portions equal to those shown in FIG. 1 are denoted by the same reference numerals so as to avoid the overlapping description.

According to the fourth embodiment of the present invention, a claw-shaped member 34, which is not formed as a separate member but is formed integral with the stiffener 14 of the interface module 7, corresponds to the connection holding member 31. A return is formed in the claw-shaped member 34, and the return is engaged with the lower edge portion of the interposer 2 so as to generate the force expanding toward the outside, thereby generating a pushing force in the vertical direction between the interface module 7 and the interposer 2. In this assembly, it is unnecessary to prepare a fixing means as a separate member so as to produce the effect of decreasing the number of parts required.

Fifth Embodiment

Figure 10A:
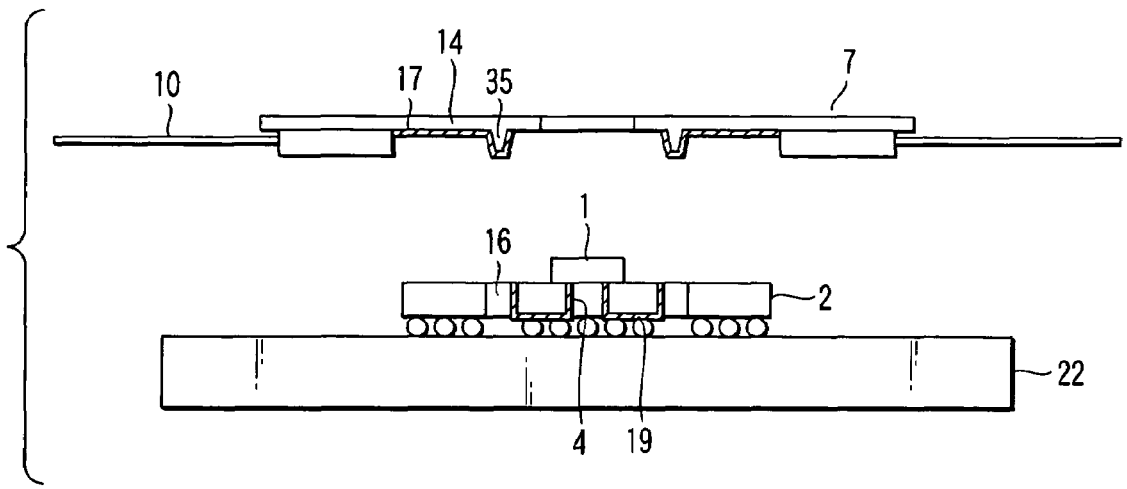
FIGS. 10A and 10B are cross-sectional views collectively showing the manufacturing process of an LSI package according to a fifth embodiment of the present invention.
Figure 10B:
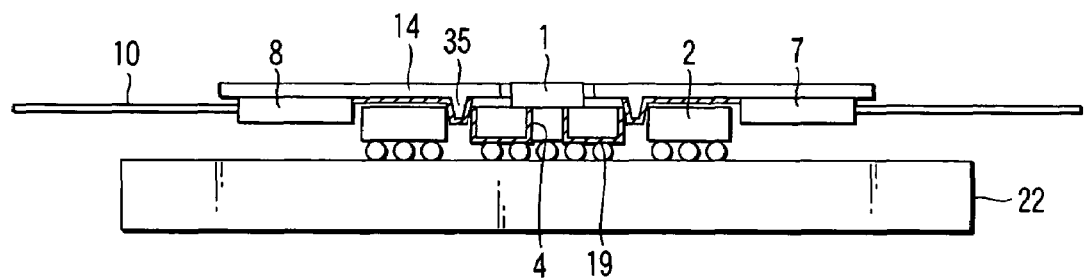
Figure 11A:
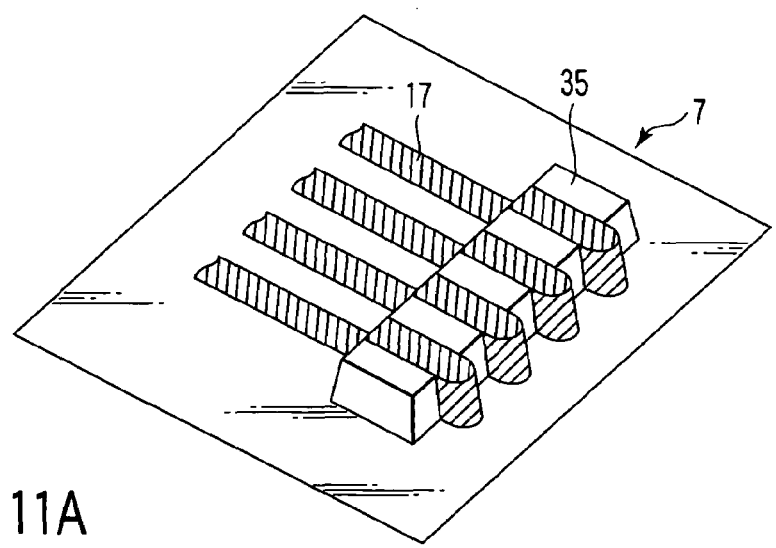
FIGS. 11A, 11B, 11C are oblique views and a plan view collectively showing schematically the construction of the assembly on the upper surface of an LSI package comprising the interface module shown in FIGS. 10A and 10B.
Figure 11B:
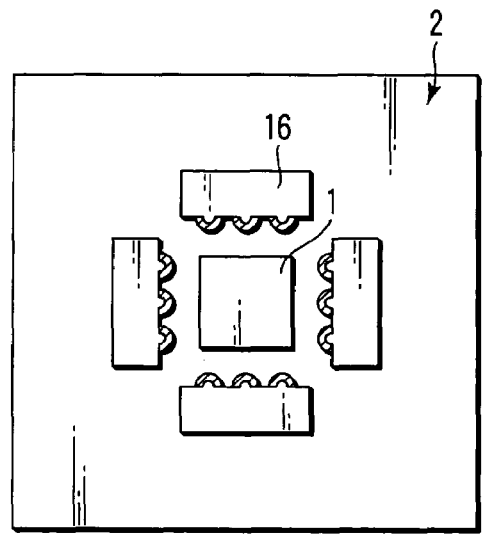
Figure 11C:
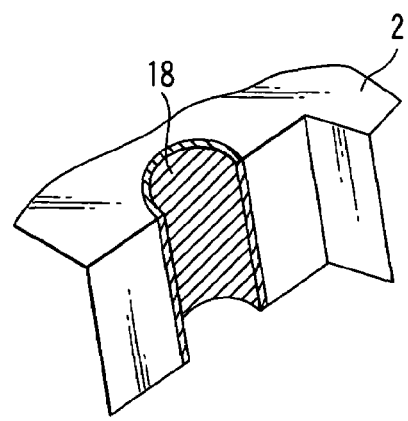

FIGS. 10A, 10B, 11A, 11B and 11C collectively show schematically the construction of an LSI package according to a fifth embodiment of the present invention, wherein FIG. 10A is a cross-sectional view showing the state before the electrical connection and fixation of the optical interface module, and FIG. 10B is a cross-sectional view showing the state after the fixation of the optical interface module. Further, FIG. 11A shows in a magnified fashion the projecting portion acting as a connection holding means, FIG. 11B is a plan view showing the arrangement as viewed from above after the connection and the fixation, and FIG. 11C is an oblique view showing in a magnified fashion the hole portion.

Incidentally, in FIGS. 10A, 10B, 11A, 11B and 11C, the portions equal to those shown in FIG. 1 are denoted by the same reference numerals so as to avoid the overlapping description.

According to the fifth embodiment of the present invention, the photoelectric converting section 8 and the optical fiber 10 are mounted on the stiffener 14. Also, the high-speed signal wiring 4 is formed by an electric wiring 17 formed on the stiffener 14. The connection holder 31, which is not formed by a separate member, comprises a projection 35 formed integral with the stiffener 14 of the interface module 7 and a hole section 16 formed in the interposer 2.

As shown in FIG. 11A, an electrode is formed on the projection 35 formed in the interface module 7, and the wiring 17 on the stiffener 14 is connected to the electrode formed on the projection 35. On the other hand, the hole section 16 is formed in the interposer 2 as shown in FIG. 11B. Further, as shown in FIG. 11C, a semicylindrical notch 18 is formed in a part of the hole section 16, and the electrode is formed within the notch 18. The shape of the projection 35 is adapted for engagement with the hole section 16, and the electrode formed on the projection 35 is arranged to face the electrode formed in the notch 18. Also, the projection 35 is tapered downward as shown in FIG. 10A. Therefore, if the projection 35 is inserted into the hole section 16, the metal electrodes formed on the projection 35 and formed inside the hole section 16 are pushed against each other so as to be deformed and engaged with each other under a pressurized state. It follows that, once the projection 35 is inserted into the hole section 16, the electrodes are put under a fixed state.

In the assembly according to the fifth embodiment of the present invention, it is unnecessary to use a pushing mechanism or the pushing member that are prepared separately. Since the fixation can be performed independently, it is possible to decrease the number of parts required. It should also be noted that, since the relative positions of the interface module 7 and the interposer 2 can be controlled by the engagement between the notch 18 and the projection 35, it is unnecessary to take a special measure for the position alignment so as to produce the effect that the electric connection can be achieved by simply pushing downward the interface module 7 under pressure. Incidentally, since the high-speed signal wiring 4 extends through the electrode formed inside the hole section 16, it is desirable to connect once the high-speed signal wiring 4 to the back surface wiring 19 of the interposer 2 and, then, to the LSI 1 on the upper surface by using the through-hole in order to decrease the reflection or loss caused by the impedance mismatch by adding an extra stub.

Sixth Embodiment

Figure 12A:
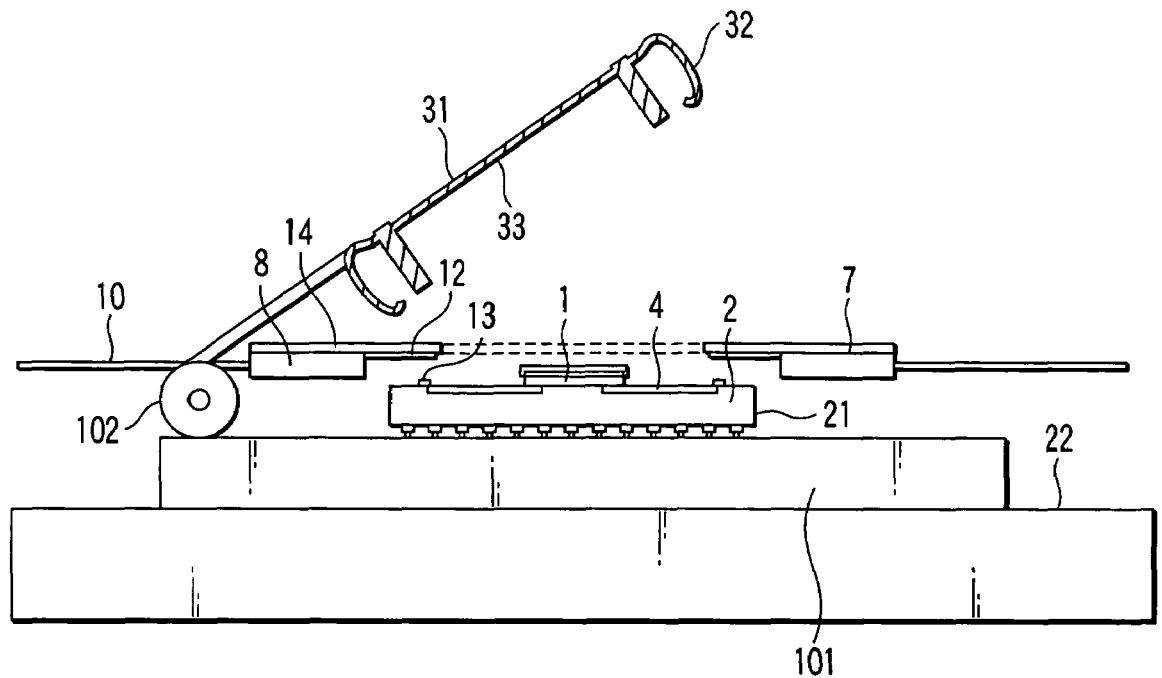
FIGS. 12A and 12B are cross-sectional views collectively showing schematically the manufacturing process of an LSI package according to a sixth embodiment of the present invention.
Figure 12B:
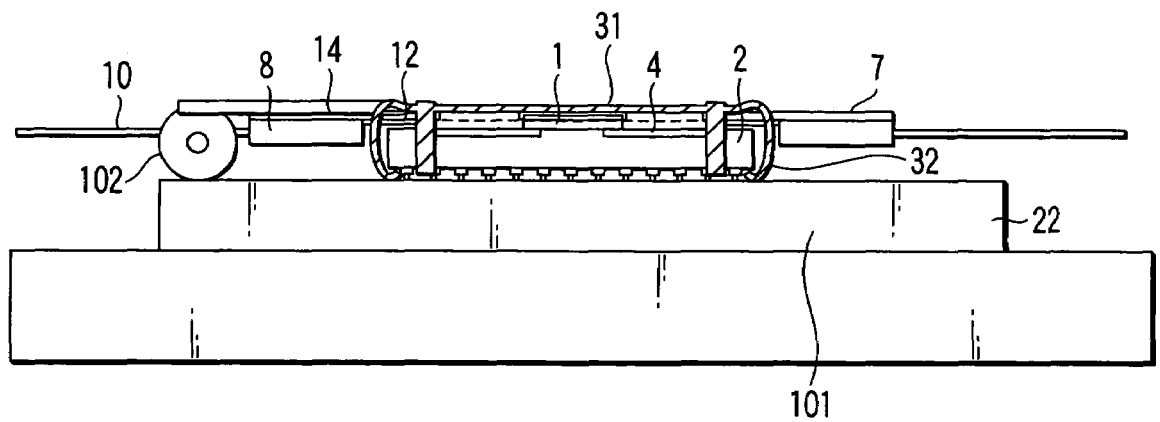

FIGS. 12A and 12B collectively show schematically the construction of an LSI package according to a sixth embodiment of the present invention, wherein FIG. 12A is a cross-sectional view showing the state before the electrical connection and fixation of the optical interface module, and FIG. 12B is a cross-sectional view showing the state after the fixation of the optical interface module. Incidentally, in FIGS. 12A and 12B, the portions equal to those shown in FIG. 1 are denoted by the same reference numerals so as to avoid the overlapping description.

In the LSI package shown in FIGS. 12A and 12B, the LSI 1 is mounted on the interposer 2 so as to be electrically connected to the interposer 2. A high-speed signal wiring 4 is formed on the interposer 4 so as to be connected at one end to the signal input-output terminal of the LSI 1. The other end of the high-speed signal wiring 4 is withdrawn on the surface side of the interposer 2 so as to constitute an electrical connection terminal connected to the interface module described herein later. A connection terminal 21 that is to be electrically connected to the mounting board 22 is arranged on the lower surface of the interposer 2. The connection terminal 21 is connected to a socket 101 mounted on the mounting board 22 so as to form an assembly that can be renewed together with the LSI package. Also, the connection holder 31 is formed integral with the socket 101 by a hinge 102 mounted on the socket 101 so as to form an openable assembly.

According to the sixth embodiment of the present invention, the LSI package can be renewed without relying on the heating process such as a soldering process. The LSI package can be renewed together with the optical interface module 7 when the assembly gets out of order. Also, the assembly is capable of coping with the up-grading easily.

Modification

The present invention is not limited to each of the embodiments described above. For example, in the embodiment described above, the connection holder includes eight hooked portions. However, the number of hooked portions is not particularly limited in the present invention as far as it is possible to secure the fixing strength and the pushing force in the vertical direction, which are sufficient for holding the electric connection. Also, the number of electrodes, the number of signal transmission lines, and the number of constituting elements of the interface module are not limited to those in the embodiments described above. It suffices to use at least one transmission line and at least one electrode.

Also, in the embodiments described above, an optical fiber is used as the transmission line. However, it is also possible for the transmission line to be formed of an electric transmission line such as a coaxial cable, a semi-rigid cable or a flexible wiring board, with substantially the same effect. To be more specific, it is possible for the optical interface module used in the embodiments described above to be replaced by an optical interface module in which are housed a line driver IC for driving the line and an electric transmission line, means for connecting the line driver IC to the electric transmission line such as a solder bump or a wire bonding, and input-output electric connection terminals connected to the input-output signal of the signal processing LSI arranged outside the interface module.

According to the present invention, the interface module is housed as a pigtail type assembly, in which one edge of the transmission line is included in the interface module, in a separate package together with the optical coupling or electrical connection holding assembly so as to miniaturize the package. Also, the interface module and the interposer are formed as an assembly in which the interface module and the interposer are electrically connected to each other by the mechanical contact via electric connection terminals mounted on the interface module and the interposer. Further, the connection holder for holding the electric connection is mounted between the interface module and the interposer. It follows that the present invention makes it possible to suppress the increase in the manufacturing cost caused by the complex construction of the assembly and to eliminate the problem in the mounting stage such as the interference of the soldered portions so as to improve the throughput of the interface.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An LSI package comprising:
   an interposer on which a signal processing LSI is mounted;
   an interface module equipped with signal transmission lines connected to an external equipment, the interface module having a through-opening for receiving the LSI;
   first electric connection terminals provided on the interposer and the interface module to mechanically and electrically connect the interposer and the interface module to each other; and
   a connection holder holding the electric connection between the interposer and the interface module.

2. The LSI package according to claim 1, wherein the interposer has a first surface, a second surface opposite to the first surface and second electric connection terminals electrically connecting the interposer to a mounting board, the first electric connection terminals being formed on the first surface, the signal processing LSI being mounted on the first surface and the second electric connection terminals being formed on the second surface.

3. The LSI package according to claim 2, wherein the connection holder has a structure engaging the interface module to the interposer at a plurality of points and impart a pushing force along a direction to maintain the electric connection between the first electric connection terminals on the interposer and the interface module.

4. The LSI package according to claim 3, wherein the connection holder has elongated portions contacted to the interface module and the interposer at a plurality of first and second engaging points on the interface module and the interposer, respectively, the elongated portions being arranged on the connection holder so as to position the electric connection terminals on a straight line joining the first and second engaging points mutually facing each other.

5. The LSI package according to claim 3, wherein the interface module has a size substantially same as that of the interposer.

6. The LSI package according to claim 2, wherein the connection holder comprises projections formed on the interface module, and holes formed in the interposer, the first electric connection terminals being formed on the projections and in the hole, respectively, and the projections being engaged under pressure with the holes to hold and fix the projections within the holes, thereby connecting the first electric connection terminals to each other.

7. The LSI package according to claim 6, wherein the interposer has a first electric wiring, which is formed on the first surface and is connected to the signal processing LSI, and a second electric wiring which is formed on the second surface, the first electric wiring is connected to the second electric wiring through the first electric connection terminals in the holes so as to electrically connect the interposer via the first electric connection terminals to the interface module.

8. The LSI package according to claim 1, wherein the connection holder has a structure engaging the interface module to the interposer at a plurality of engaging points and impart a pushing force along a direction to maintain the electric connection between the first electric connection terminals on the interposer and the interface module.

9. The LSI package according to claim 8, wherein the connection holder has elongated portions contacted to the interface module and the interposer at a plurality of first and second engaging points on the interface module and the interposer, respectively, the elongated portions being arranged on the connection holder so as to position the first electric connection terminals on a straight line joining the first and second engaging points mutually facing each other.

10. The LSI package according to claim 8, wherein the interface module has a size substantially same as that of the interposer.

11. The LSI package according to claim 1, wherein the connection holder comprises projections formed on the interface module, and holes formed in the interposer, the first electric connection terminals being formed on the projections and in the hole, respectively, and the projections being engaged under pressure with the holes to hold and fix the projections within the holes, thereby connecting the first electric connection terminals to each other.

12. An interface module, which is mechanically and electrically connected to an interposer having a signal processing LSI mounted thereto with electric connection terminals interposed thereon, said interface module comprising:
   a supporting substrate having signal transmission lines, the signal transmission lines connected to an external equipment, the supporting substrate having a through-opening for receiving the LSI; and a claw-shaped member mounted on the supporting substrate, engaged with the interposer, and imparting a pushing force in the direction in which the electric connection is held by the electric connection terminals.

13. A connection holder used in an LSI package, in which an interposer having a signal processing LSI mounted thereto and an interface module having signal transmission lines connected to an external equipment, are mechanically and electrically connected to each other with electric connection terminals interposed therebetween, said connection holder serving to hold the mechanical and electrical connection between the interposer and the interface module;

wherein the connection holder comprises a portion of projecting parallels abutting against the interface module opposite to the interposer and a key-shaped portion formed in each edge portion of the portion of the projecting parallels and engaged with the interposer, and the interface module has a through-opening for receiving the LSI.

* * * * *